United States Patent
Kim

(10) Patent No.: US 7,880,289 B2
(45) Date of Patent: Feb. 1, 2011

(54) SEMICONDUCTOR PACKAGE AND METHOD OF FABRICATING THE SAME AND SEMICONDUCTOR MODULE AND METHOD OF FABRICATING THE SAME

(75) Inventor: Shin Kim, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 260 days.

(21) Appl. No.: 11/752,770

(22) Filed: May 23, 2007

(65) Prior Publication Data

US 2008/0012117 A1 Jan. 17, 2008

(30) Foreign Application Priority Data

Jul. 11, 2006 (KR) .................. 10-2006-0064974

(51) Int. Cl.
H01L 23/48 (2006.01)
H01L 21/30 (2006.01)
H01L 21/58 (2006.01)

(52) U.S. Cl. ..................................................... 257/693

(58) Field of Classification Search .................. 257/693, 257/785, 685–686, 738, 772, 779–781, 257, 257/594, 618, 622, 778, E21.503, 734, 780, 257/527, 758; 438/114, 118, 33, 68, 107, 438/113, 460–465

See application file for complete search history.

(56) References Cited

U.S. PATENT DOCUMENTS 6,287,895 B1 9/2001 Sato
6,544,821 B2 * 4/2003 Akram ...................... 438/127
6,903,451 B1 6/2005 Kim et al.
2004/0094841 A1 * 5/2004 Matsuzaki et al. .......... 257/758
2006/0240586 A1 * 10/2006 Kobayashi et al. ............. 438/26

FOREIGN PATENT DOCUMENTS

JP 62-262447 11/1987
JP 03-142993 6/1991
JP 2004-079666 3/2004

OTHER PUBLICATIONS

English language abstract of Japanese Publication No. 62-262447.
English language abstract of Korean Publication No. 03-142993.
English language abstract of Korean Publication No. 2004-079666.

* cited by examiner

Primary Examiner—Dao H Nguyen
Assistant Examiner—Tram H Nguyen
(74) Attorney, Agent, or Firm—Volentine & Whitt, PLLC

(57) ABSTRACT

Provided are a semiconductor package having connection terminals whose side surfaces are exposed and a semiconductor module including such a semiconductor package. Also provided are methods of fabricating the semiconductor package and semiconductor module. According to an embodiment of the present invention, a semiconductor package includes a semiconductor chip including a semiconductor wafer having first and second opposite surfaces and a plurality of conductive pads arranged in a row on the first surface along the edges of the semiconductor wafer such that a side surface of each conductive pad is exposed. An insulating layer is formed on the first surface of the semiconductor wafer and includes openings for exposing parts of the conductive pads. A plurality of connection terminals are respectively arranged on the conductive pads exposed through the openings and a reinforcing member is arranged on the insulating layer to cover a portion of each connection terminal.

30 Claims, 17 Drawing Sheets

SEMICONDUCTOR PACKAGE AND METHOD OF FABRICATING THE SAME AND SEMICONDUCTOR MODULE AND METHOD OF FABRICATING THE SAME

CROSS-REFERENCE TO RELATED PATENT APPLICATION

This application claims the benefit of Korean Patent Application No. 10-2006-0064974, filed on Jul. 11, 2006, in the Korean Intellectual Property Office, the disclosure of which is incorporated herein in its entirety by reference.

BACKGROUND

1. Field of the Invention

The present invention relates to a semiconductor package, and more particularly, to a wafer level package having connection terminals whose side surfaces are exposed and a method of fabricating the same. The present invention also relates to a semiconductor module including a wafer level package having connection terminals whose side surfaces are exposed, and a method of fabricating the same.

2. Description of the Related Art

A semiconductor package serves to electrically connect inputs and outputs of a semiconductor chip to an external circuit and to protect the semiconductor chip. As electronic devices get smaller and lighter and have higher performances, small, light, economical, and highly reliable semiconductor packages are required. To satisfy these requirements, wafer level packages have been developed in which the assembling or packaging of a semiconductor chip is completed at a wafer level. In the wafer level package, all semiconductor chips on a wafer are collectively subject to fabrication processes such as assembling processes, resulting in greatly reduced semiconductor device fabrication costs, better incorporation of packaging functions and semiconductor chip functions, improvements in thermal and electrical characteristics of the semiconductor devices, and miniaturization of the package to the relative dimension of the semiconductor chip.

FIG. 1 is a cross-sectional view illustrating a conventional wafer level package 100.

Referring to FIG. 1, a metal pad 120 is formed on a front surface of a wafer 110. A metal wiring layer 150 is electrically connected to the metal pad 120 and to a solder ball 170. A first insulating layer 130 and a second insulating layer 140 are formed between the metal pad 120 and the metal wiring layer 150, and a third insulating layer 160 is formed on the metal wiring layer 150. The first to third insulating layers 130, 140, and 160 include openings 135, 145, and 165, respectively.

In the conventional wafer level package 100, the metal wiring layer 150 is made of, for example, copper, and generally needs to be redistributed on the semiconductor chip in order to adhere the solder ball 170 to the metal pad 120 of the semiconductor chip for a proper electrical connection with an external circuit. Such a redistribution process of the metal wiring layer 150 increases the fabricating cost and the metal wiring layer 150 may be separated from the surface of the semiconductor chip, thereby degrading the reliability of the package.

Furthermore, the area of the semiconductor chip limits the number of the solder balls 170 that can be arranged on the semiconductor chip. Accordingly, it is difficult to lay out a large number of solder balls 170 on the semiconductor chip. To solve this problem, the solder balls 170 can be reduced in size so that a plurality of the solder balls 170 can be more easily arranged on the semiconductor chip. However, the reduced size of the solder ball weakens the adhesion of the solder ball to the underlying metal pad.

SUMMARY

The present invention provides a wafer level package which is robust against external shocks and has an increased number of connection terminals by arranging connection terminals on a side surface of a semiconductor package. Also provided is a method of fabricating the above wafer level package.

Additionally, the present invention provides a semiconductor module including a wafer level package having connection terminals arranged on a side surface of a semiconductor package, and a method of fabricating the same.

According to an embodiment of the present invention, a semiconductor package includes a semiconductor chip that includes a semiconductor wafer having first and second opposite surfaces, and a plurality of conductive pads arranged in a row on the first surface along edges of the semiconductor wafer, where a side surface of each conductive pad is exposed. An insulating layer is formed on the conductive pads and the first surface of the semiconductor wafer and includes openings for exposing parts of the conductive pads. A plurality of connection terminals are respectively arranged on the conductive pads exposed through the openings and are in electrical contact with the conductive pads, where a side surface of each connection terminals is exposed. A reinforcing member is arranged on the insulating layer for covering a part of each connection terminal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully hereinafter with reference to the accompanying drawings, in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers designate like elements throughout the drawings.

Figure 1:
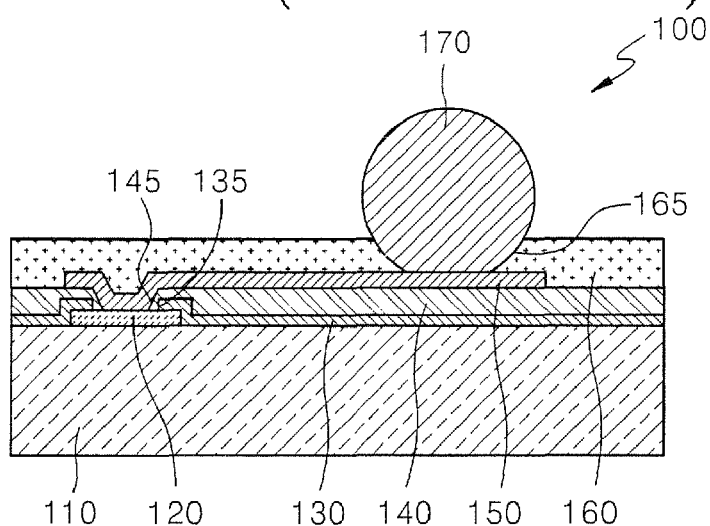
FIG. 1 is a cross-sectional view illustrating a conventional wafer level package.
Figure 2A:
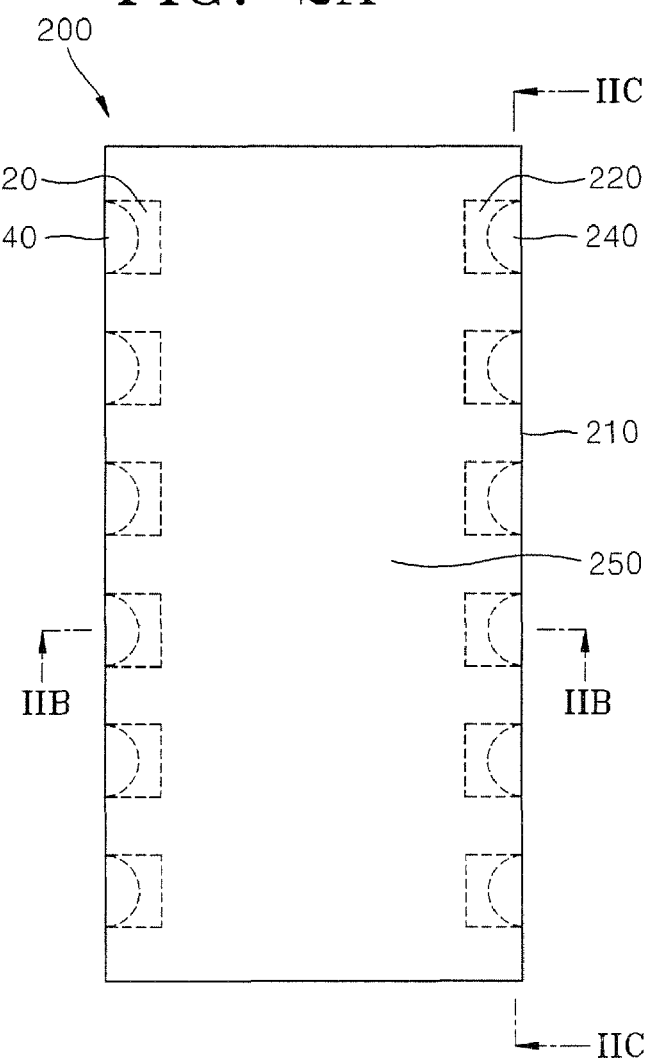
FIG. 2A is a plan view illustrating a wafer level package according to an embodiment of the present invention.
Figure 2B:
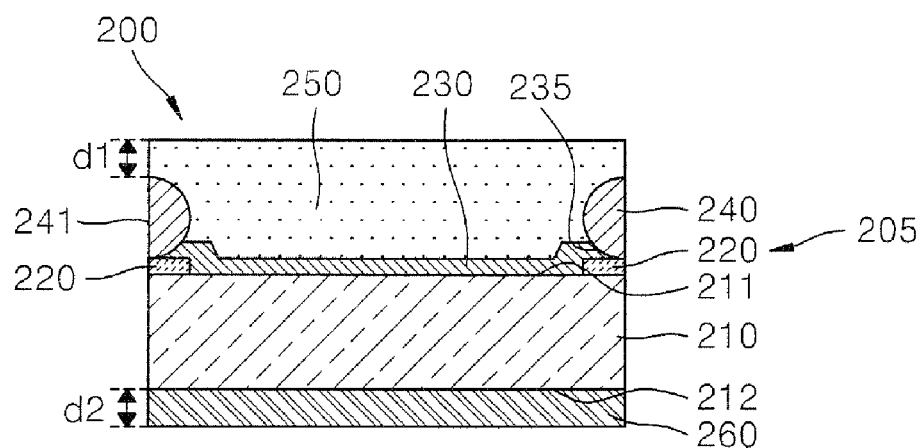
FIG. 2B is a cross-sectional view of the wafer level package taken along line IIB-IIB of FIG. 2A.
Figure 2C:
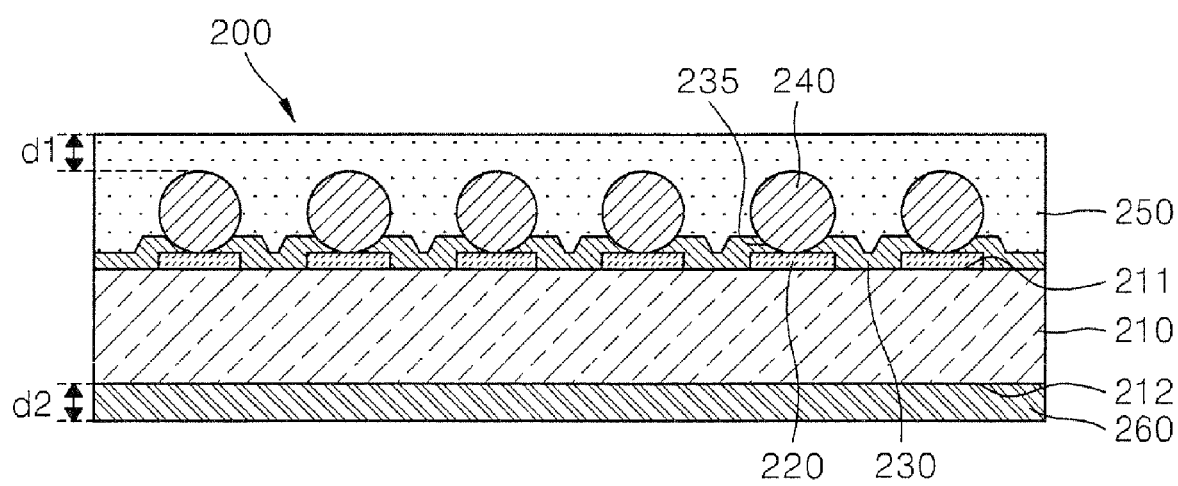
FIG. 2C is a cross-sectional view of the wafer level package taken along line IIC-IIC of FIG. 2A.

FIG. 2A is a plan view illustrating a wafer level package according to an embodiment of the present invention, FIG. 2B is a cross-sectional view of the wafer level package taken along line IIB-IIB of FIG. 2A, and FIG. 2C is a cross-sectional view of the wafer level package taken along line IIC-IIC of FIG. 2A.

Referring to FIGS. 2A, 2B, and 2C, a wafer level package 200 includes a semiconductor chip 205. The semiconductor chip 205 includes a wafer 210 and conductive pads, e.g., metal pads 220 formed on a front surface 211 of the wafer 210. The metal pads 220 are arranged in a row along edges of the wafer 210. Here, the front surface 211 of the wafer 210 refers to a surface on which the semiconductor chip 205 including various semiconductor devices (not shown) is integrated through semiconductor fabrication processes. The metal pads 220 formed on the front surface 211 of the wafer 210 may include pads, e.g., aluminum pads for electrically connecting the semiconductor device to an external circuit (not shown).

An insulating layer 230 is formed on the front surface 211 of the wafer 210. The insulating layer 230 includes openings 235 exposing parts of the metal pads 220. Since the metal pads 220 are arranged contiguous until the edge of the wafer 210, top and side surfaces of each metal pad 220 are exposed by an opening 235. The insulating layer 230 may be a passivation layer and may include $SiO_2$, $Si_3N_4$, phospho silicate glass (PSG), or the like.

Connection terminals 240 are respectively formed on the metal pads 220 exposed by the openings 235. The connection terminals 240 are also arranged in a row along the edges of the wafer 210. The connection terminals 240 are arranged contiguous until the edges of the wafer 210 and side surfaces 241 thereof are exposed, similar to the metal pads 220. The connection terminals 240 may have any one of various shapes, including solder balls or bumps. The connection terminals 240 are connection members for electrically connecting the semiconductor chip 205 to an external circuit (not shown) through the exposed side surfaces 241 of the connection terminals 240.

A front reinforcing member 250 is formed on the front surface 211 of the wafer 210, and a rear reinforcing member 260 is formed on a surface opposing the front surface 211 of the wafer 210, i.e., a rear surface 212. The front reinforcing member 250 and the rear reinforcing member 260 may be formed of an epoxy molding compound. The front reinforcing member 250 may have a predetermined thickness to prevent the connection terminals 240 from being exposed to an external circuit. The front reinforcing member 250 is formed to a thickness d1 of about 200 μm or less, where the thickness d1 is measured from an upper surface of the connection terminals 240 to the top surface of the front reinforcing member 250. The thickness d1 may be about 50 to about 200 μm. The rear reinforcing member 260 has a thickness d2 of about 100 μm or less. The thickness d2 may be about 50 to about 100 μm. Since each connection terminal 240 is sealed by the front reinforcing member 250 such that the side surface 241 of the connection terminal 240 is the only portion of the connection terminal 240 exposed, the connection terminal 240 is electrically connected to an external circuit through the exposed side surface 241.

Although in this embodiment the front reinforcing member 250 and the rear reinforcing member 260 have been illustrated as being respectively formed on the front surface 211 and rear surface 212 of the wafer 210, only the front reinforcing member 250 may be formed on the front surface 211. In addition, a cross-sectional structure of the semiconductor chip 205 is not limited to that shown in FIGS. 2B and 2C but may have various structures.

Furthermore, although the connection terminals 240 have been illustrated as being arranged along the edges of the wafer 210 on two opposite sides of the four illustrated sides of the semiconductor package 200, the connection terminals 240 may be arranged along only one edge of the wafer 210, or alternatively may be arranged on three sides of the wafer or all four sides of the semiconductor package 200. Although the connection terminals 240 have been illustrated as having a semicircular shape, the connection terminals 240 are not limited to this specific shape, and may therefore have various shapes.

FIGS. 3A through 3E are plan views illustrating a method of fabricating a wafer level package according to an embodiment of the present invention. FIGS. 4A through 4E are cross-sectional views of the wafer level package taken along line IV-IV of FIGS. 3A through 3E.

Figure 3A:
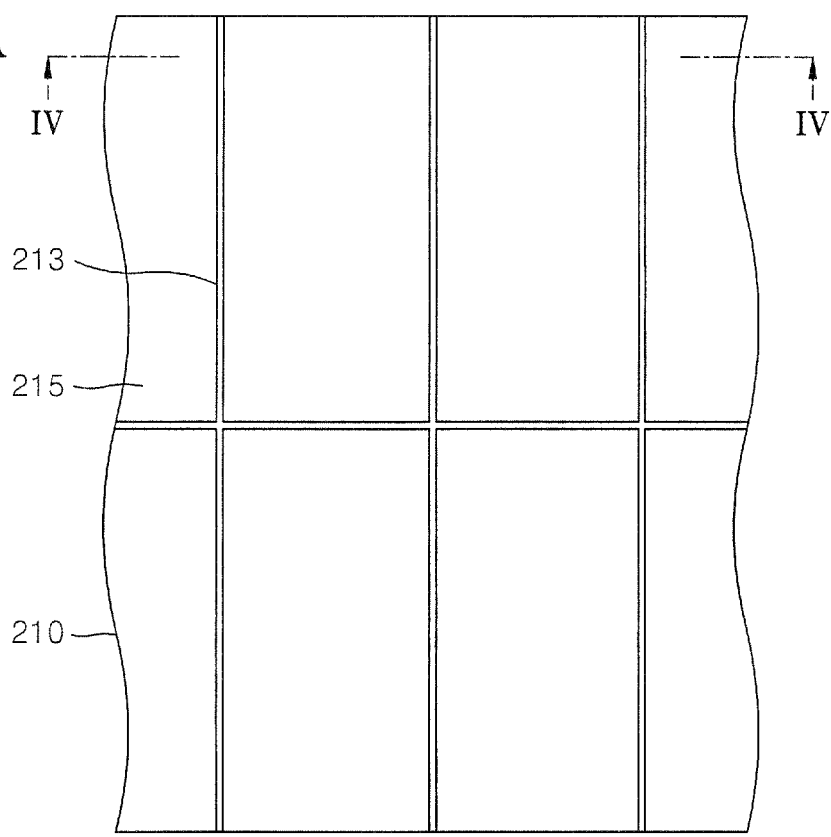
FIGS. 3A through 3E are plan views illustrating a method of fabricating a wafer level package according to an embodiment of the present invention.
Figure 4A:
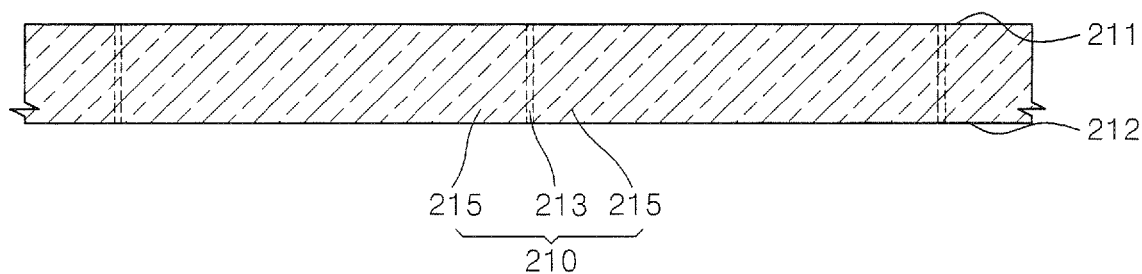
FIGS. 4A through 4E are cross-sectional views of the wafer level package taken along line IV-IV of FIGS. 3A through 3E.

Referring to FIGS. 3A and 4A, a semiconductor wafer 210 is prepared. The semiconductor wafer 210 includes a plurality of semiconductor chip regions 215 defined by a plurality of scribe lanes 213. Each scribe lane 213 has a width of about 10 to about 150 μm, but is not necessarily limited thereto.

Figure 3B:
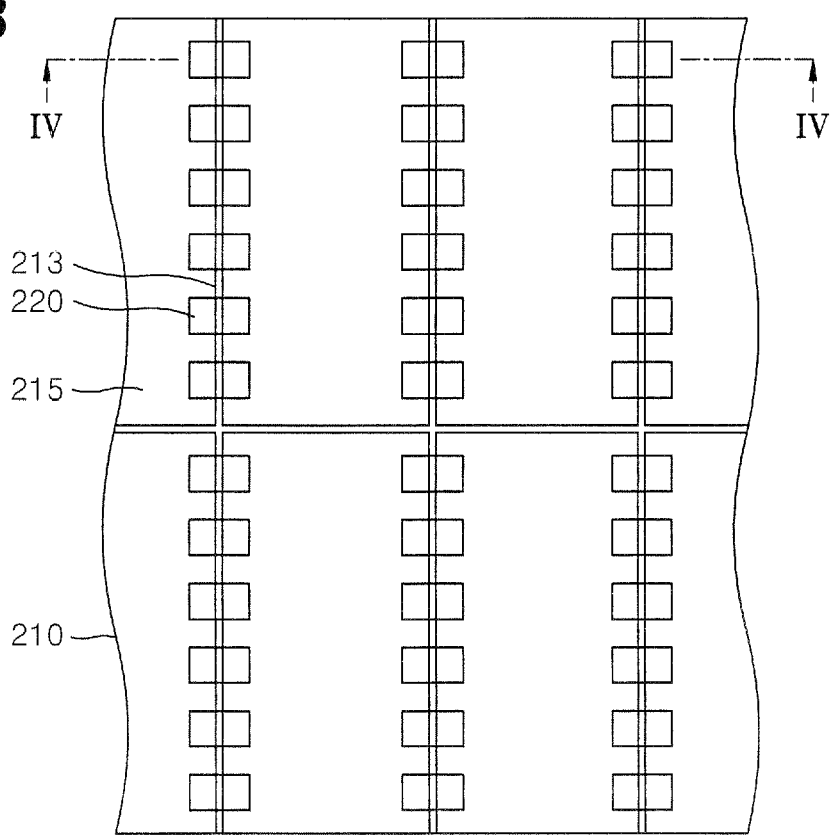
Figure 4B:
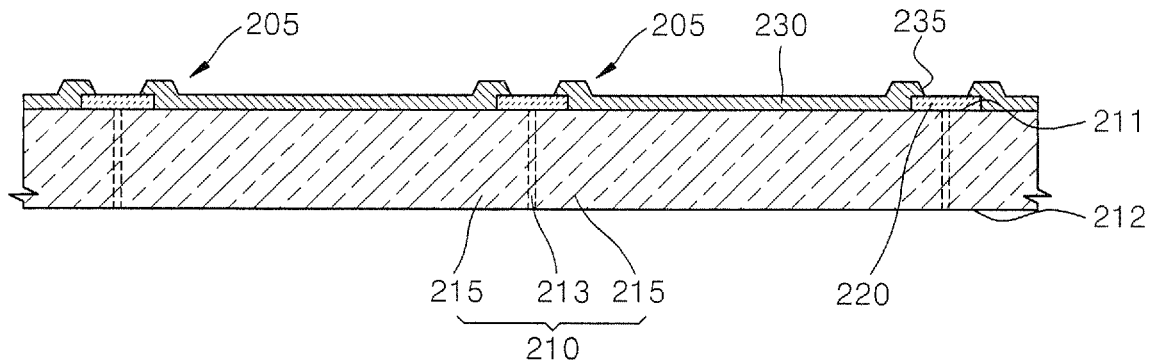

FIG. 3B is a plan view illustrating the wafer level package after metal pads are formed, and FIG. 4B is a cross-sectional view illustrating the wafer level package after an insulating layer having openings is formed. Referring to FIGS. 3B and 4B, metal pads 220 are formed on a front surface 211 of the wafer 210. The metal pads 220 are formed at edges of the semiconductor chip regions 215 and across the scribe lanes 213. That is, the metal pads 220 are formed across the scribe lanes 213 between adjacent semiconductor chip regions 215. An insulating layer 230 for passivation is formed on the front surface 211 of the wafer 210 having the metal pads 220. The insulating layer 230 is etched to form openings 235 for exposing part of the metal pads 220. Each opening 235 exposes at least the portion of the metal pad 220 corresponding to the scribe lane 213 and the edges of the semiconductor chip regions 215 adjacent to the scribe lane 213. Semiconductor chips 205 are arranged in the adjacent semiconductor chip regions 215 having the scribe lane 213 interposed therebetween, and share the metal pad 220 and the connection terminal 240 shown in FIG. 4C.

Figure 3C:
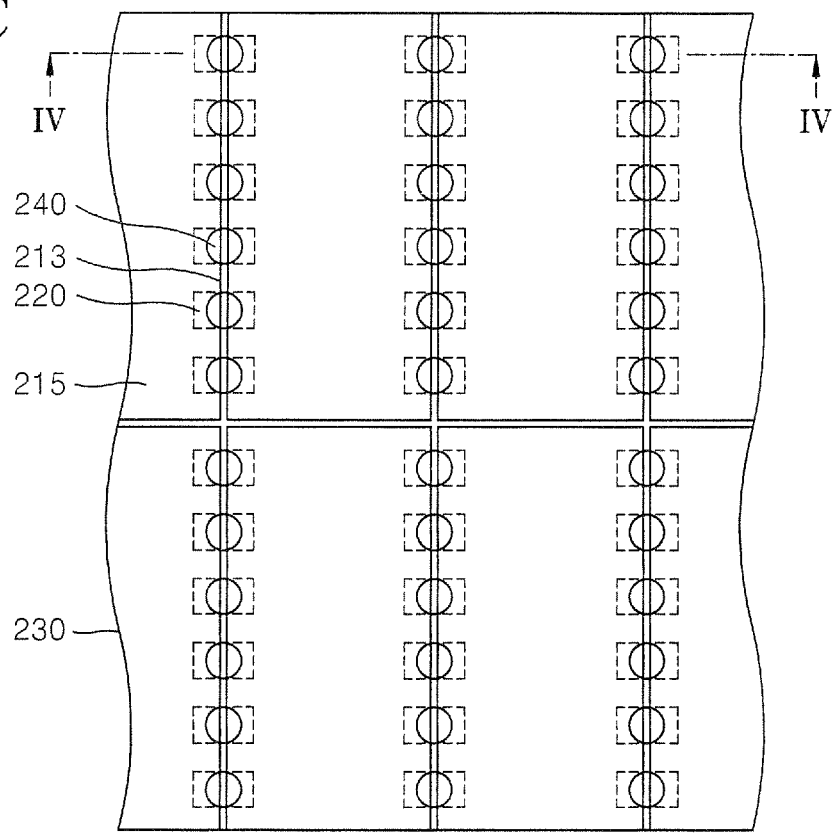
Figure 4C:
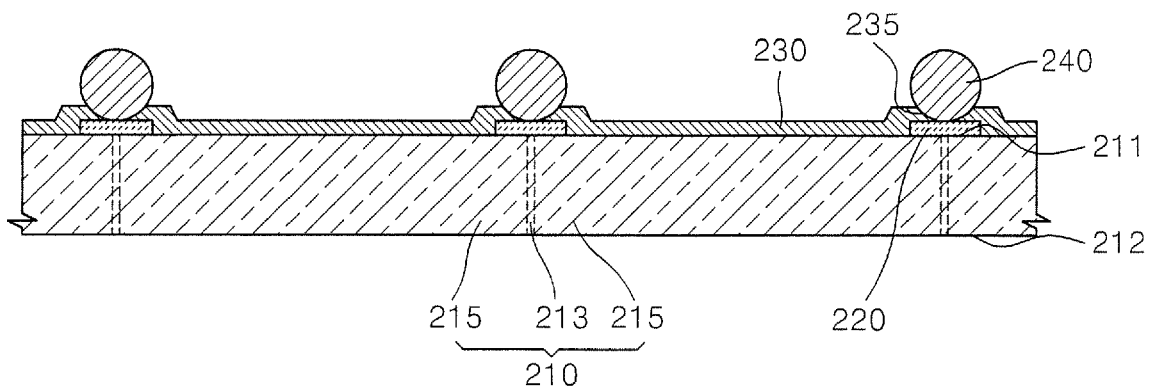

Referring to FIGS. 3C and 4C, a connection terminal 240 is formed on each of the metal pads 220, exposed through an opening 235 in the insulating layer 230. For the connection terminal 240, a bump may be formed through a wire bonding process or solder ball may be formed. The connection terminal 240 is electrically connected to the metal pad 220 on the scribe lane 213.

Figure 3D:
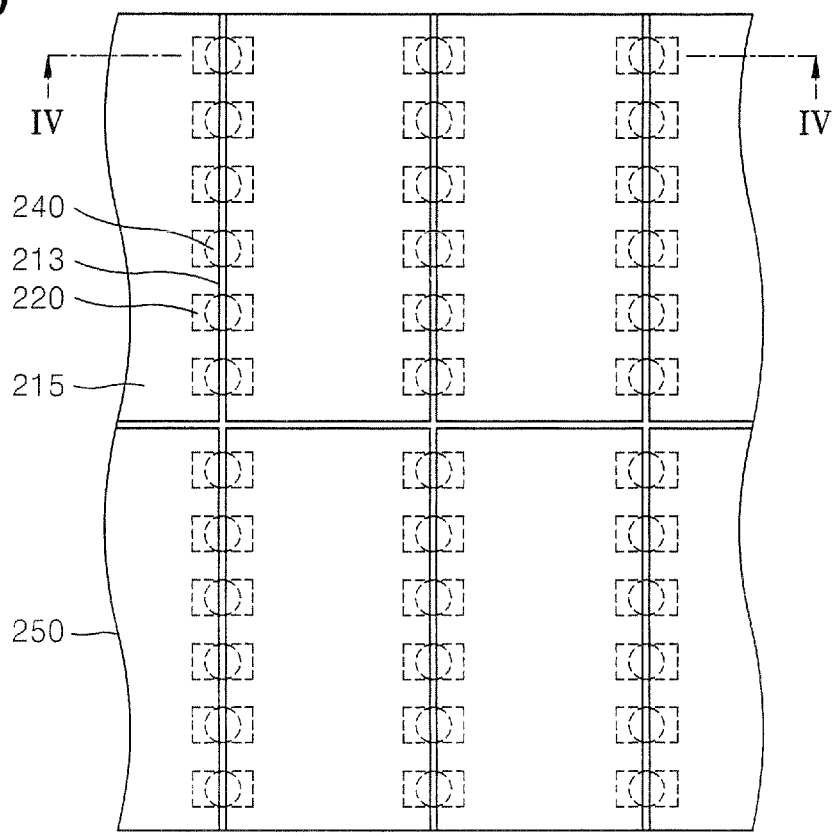
Figure 4D:
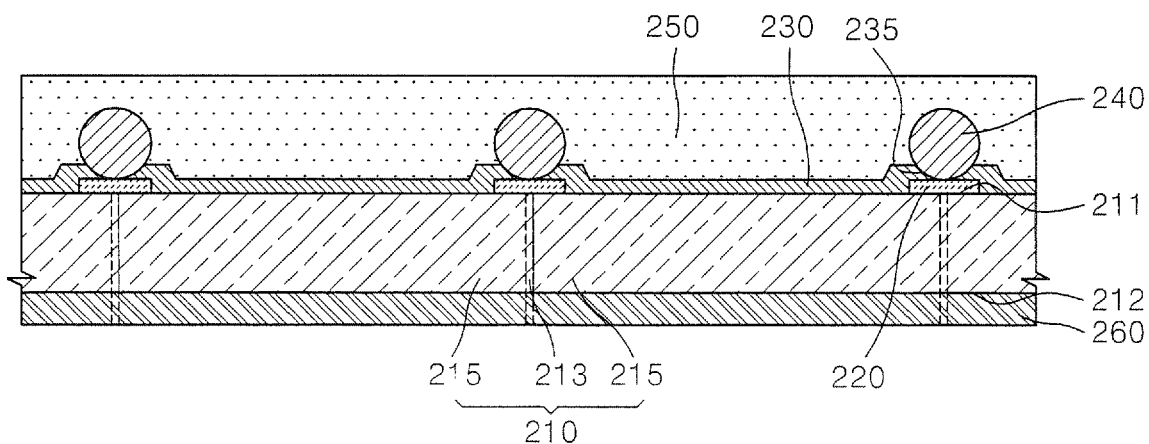

Referring to FIGS. 3D and 4D, the front surface 211 of the wafer 210, on which the connection terminals 240 are formed, and a rear surface 212 are respectively molded with epoxy molding compounds 250 and 260 through an epoxy molding process. The epoxy molding compounds 250 and 260 serve as a front reinforcing member and a rear reinforcing member, respectively. The front reinforcing member 250 is formed to a thickness d1 of at least about 200 μm or less, preferably about 50 to about 200 μm, as measured between the top surface of the front reinforcing member 250 and the surface of each connection terminal 240 (see FIG. 2B). The rear reinforcing member 260 is formed to a thickness d2 of at least about 100 μm or less, preferably about 50 to about 100 μm.

The wafer 210 may have a desired thickness formed through a back-lap process of its rear surface 212 of the wafer 210 prior to the molding process. The front reinforcing member 250 may be formed by forming an epoxy molding compound to a desired thickness d1 on the front surface 211 of the wafer 210 through a molding process or by forming thick epoxy molding compound on the front surface 211 of the wafer 210 and then lapping the epoxy molding compound to the desired thickness d1 through a back-lap process. Similarly, the rear reinforcing member 260 may be formed by forming an epoxy molding compound to a desired thickness d2 on the rear surface 212 of the wafer 210 through a molding process or by forming a thick epoxy molding compound on the rear surface 212 of the wafer 210 through a molding process and then lapping the epoxy molding compound to the desired thickness d2 through a back-lap process.

Figure 3E:
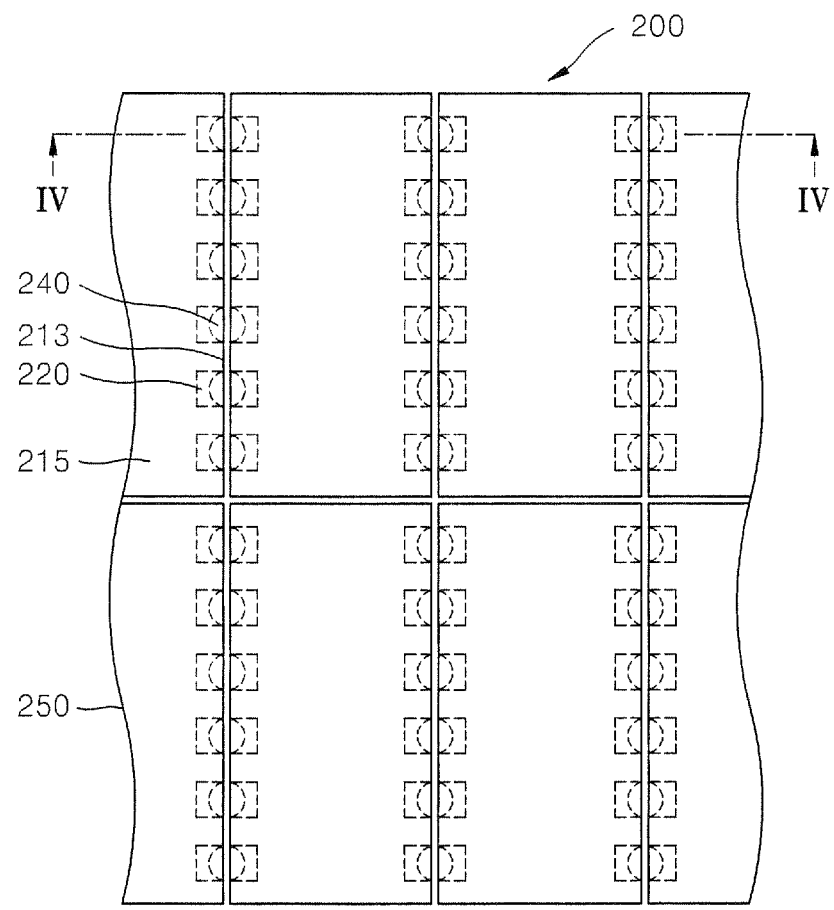
Figure 4E:
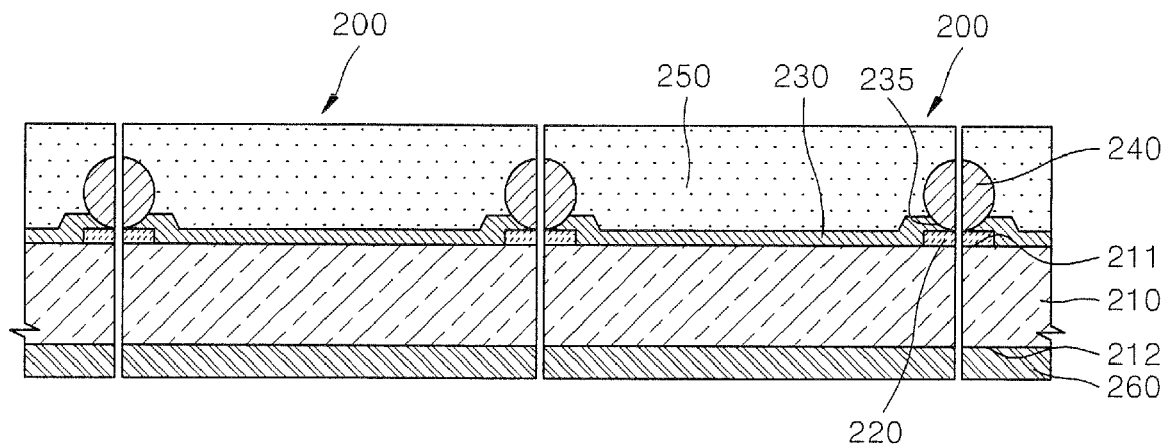

Referring to FIGS. 3E and 4E, the wafer 210 is cut along each scribe lane 213, thereby obtaining discrete semiconductor packages, such as the semiconductor package 200 shown in FIGS. 2A to 2C. The wafer may be cut along each scribe lane 213 using a laser beam or a blade. The metal pads 220 and the connection terminals 240, which are shared between the semiconductor chips 205 arranged on the adjacent semiconductor chip regions 215 with the scribe lane 213 interposed therebetween, are separated through the above cutting process. In this case, the wafer 210 may be cut so that the sizes of the metal pads 220 and the connection terminals 240 connected thereto become about ½ of the previous size. A top surface of each connection terminal 240 is still covered by the front reinforcing member 250 after the cutting process; however, side surfaces of the connection terminals 240 are exposed through the cutting process. With this configuration, electrical connections with one or more external circuits are made through the side surfaces of the connection terminals 240.

Figure 5:
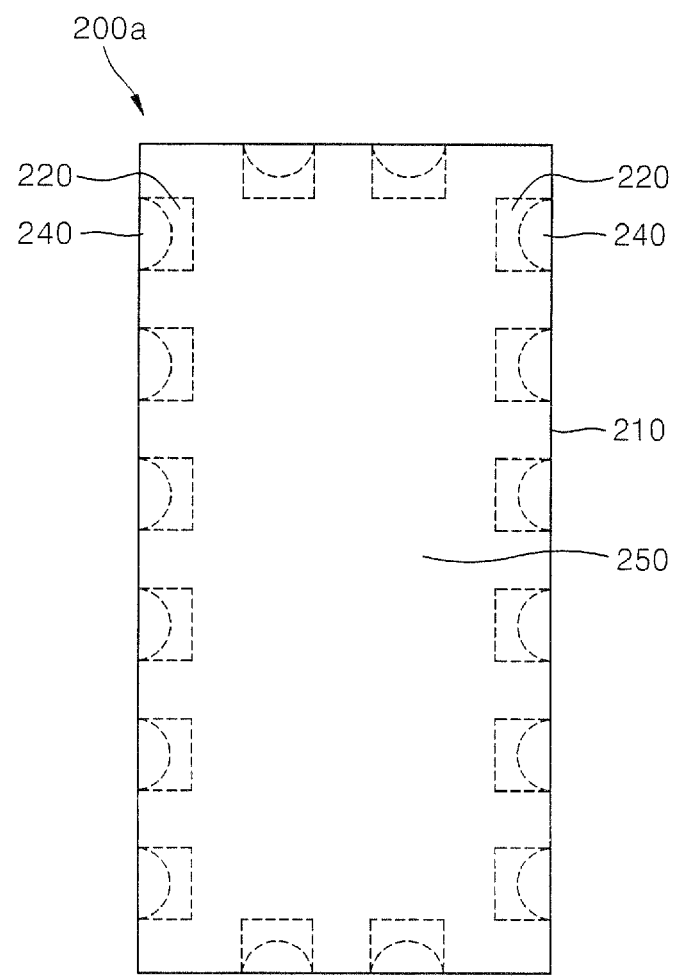
FIG. 5 is a plan view illustrating a wafer level package according to another embodiment of the present invention.

FIG. 5 is a plan view illustrating a wafer level package according to another embodiment of the present invention. In this embodiment, a wafer level package 200a includes metal pads 220 and connection terminals 240 formed on four sides of the wafer level package 200a along edges of a wafer 210. Thus, a pitch between the connection terminals can be made finer and the number of the connection terminals can be increased without increasing the size of the semiconductor chip. The cross-section of this wafer level package 200a is similar to that of the wafer level package 200 shown in FIGS. 2A and 2B, and a fabrication method thereof is similar to that of the wafer level package 200 shown in FIGS. 3A through 3E and 4A through 4E. Thus, a detailed description thereof will be omitted.

Figure 6A:
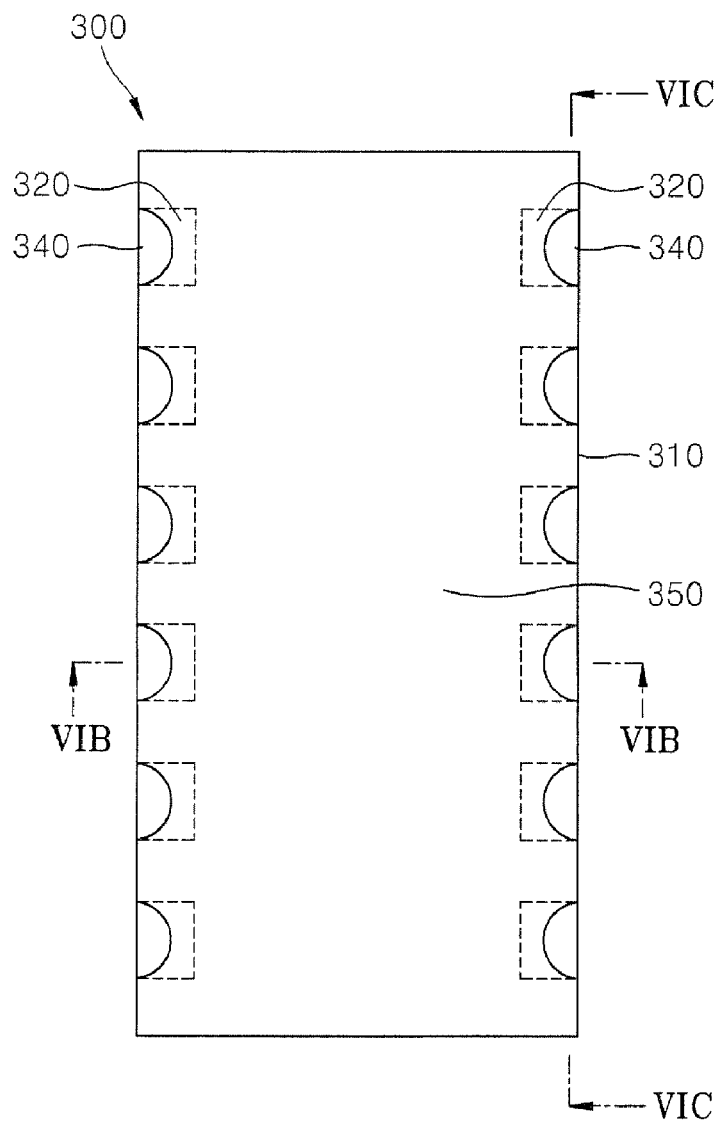
FIG. 6A is a plan view illustrating a wafer level package according to another embodiment of the present invention.
Figure 6B:
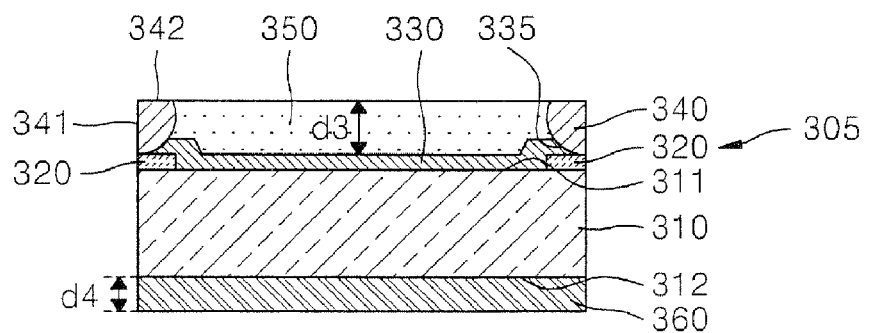
FIG. 6B is a cross-sectional view of the wafer level package taken along line VIB-VIB of FIG. 6A.
Figure 6C:
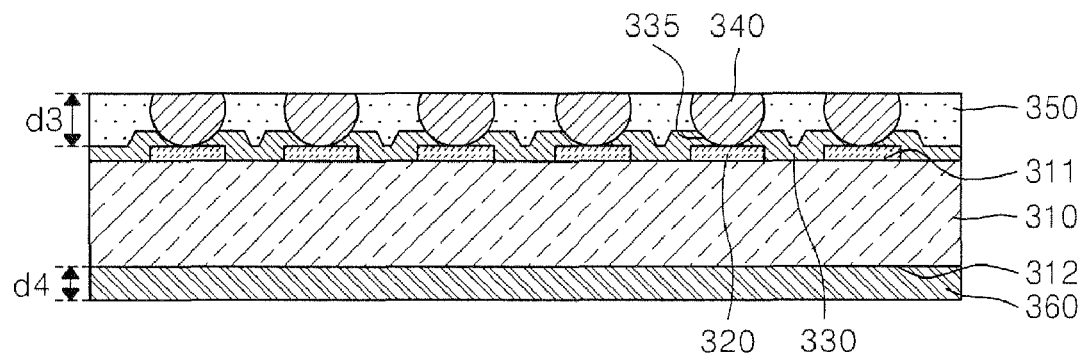
FIG. 6C is a cross-sectional view of the wafer level package taken along line VIC-VIC of FIG. 6A.

FIG. 6A is a plan view illustrating a wafer level package according to another embodiment of the present invention, FIG. 6B is a cross-sectional view of the wafer level package taken along line VIB-VIB of FIG. 6A, and FIG. 6C is a cross-sectional view of the wafer level package taken along line VIC-VIC of FIG. 6A. The wafer level package 300 shown in FIGS. 6A to 6C includes connection terminals 340 whose side and top surfaces are exposed, unlike the wafer level package 200 shown in FIGS. 2A to 2C.

Referring to FIGS. 6A, 6B, and 6C, the wafer level package 300 includes a semiconductor chip 305. The semiconductor chip 305 includes a wafer 310 and conductive pads, e.g., metal pads 320, formed on the front surface 311 of the wafer 310. The metal pads 320 are arranged in a row along edges of the wafer 310.

An insulating layer 330 having openings 335 to expose parts of the metal pads 320 is formed on the front surface 311 of the wafer 310. The metal pads 320 are arranged in a row along the edges of the wafer 310 such that top and side surfaces thereof are exposed.

The connection terminals 340, which are members for connecting the semiconductor chips 305 with one or more external circuits (not shown), are formed on the metal pads 320 exposed by the openings 335, respectively, and arranged in a row along the edges of the wafer 310. A side surface 341 and a top surface 342 of each connection terminal 340 are exposed. Through the exposed side surface 341 and/or the top surface 342, the semiconductor chip 305 may be electrically connected with the external circuit. The connection terminals 340 may have several shapes such as solder balls or bumps.

A front reinforcing member 350 is formed on the front surface 311 of the wafer 310, and a rear reinforcing member 360 is formed on a rear surface 312 of the wafer 310. The front reinforcing member 350 and the rear reinforcing member 360 are formed of an epoxy molding compound. The front reinforcing member 350 is formed in such a manner that the top surface 342 of each connection terminal 340 is exposed. The front reinforcing member 350 may be formed to a thickness d3 (measured from the exposed top portion 342 of the connection terminal 340 to the top surface of the insulating layer 330) that can sufficiently support the connection terminals 340 while securing a maximum exposed area of the top surface 342 of the connection terminals 340. When each connection terminal 340 is formed in a shape of a ball, the thickness d3 may be formed to a thickness at which a size of the connection terminal 340 becomes half the ball size since an area of the top surface 342 of the connection terminal 340 is maximized when the front reinforcing member 350 has half the ball size. The rear reinforcing member 360 has a thickness d4 of at least about 100 μm or less, preferably about 50 to about 100 μm.

Although in this embodiment the front reinforcing member 350 and the rear reinforcing member 360 have been illustrated as being respectively formed on the front surface 311 and the rear surface 312 of the wafer 310, only the front reinforcing member 350 may be formed on the front surface 311.

FIGS. 7A through 7F are plan views illustrating a method of fabricating a wafer level package according to another embodiment of the present invention. FIGS. 8A through 8F are cross-sectional views of the wafer level package taken along line VIII-VIII of FIGS. 7A through 7F.

Figure 7A:
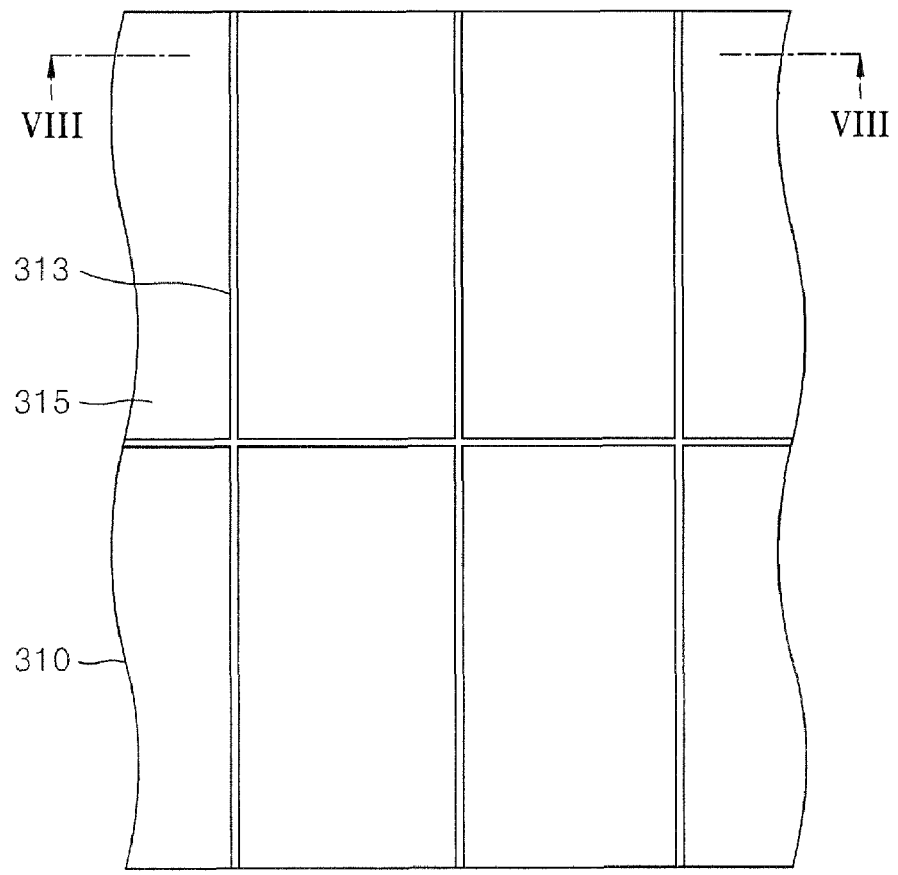
FIGS. 7A through 7F are plan views illustrating a method of fabricating a wafer level package according to another embodiment of the present invention.
Figure 8A:
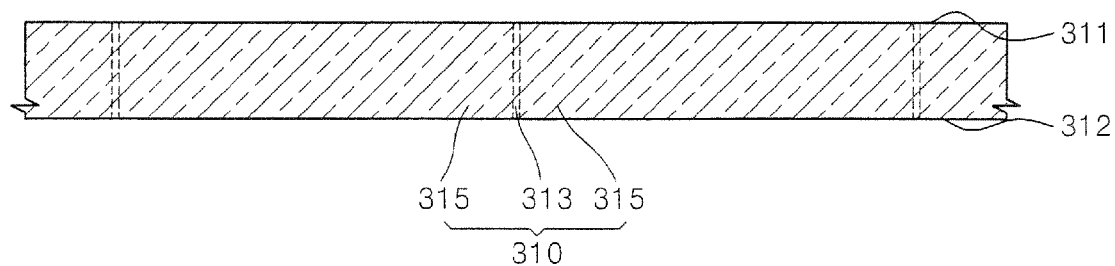
FIGS. 8A through 8F are cross-sectional views of the wafer level package taken along line VIII-VIII of FIGS. 7A through 7F.

Referring to FIGS. 7A and 8A, a semiconductor wafer 310 is prepared. The semiconductor wafer 310 includes a plurality of semiconductor chip regions 315 defined by a plurality of scribe lanes 313. Each scribe lane 313 has a width of about 10 to about 150 μm, but is not necessarily limited thereto.

Figure 7B:
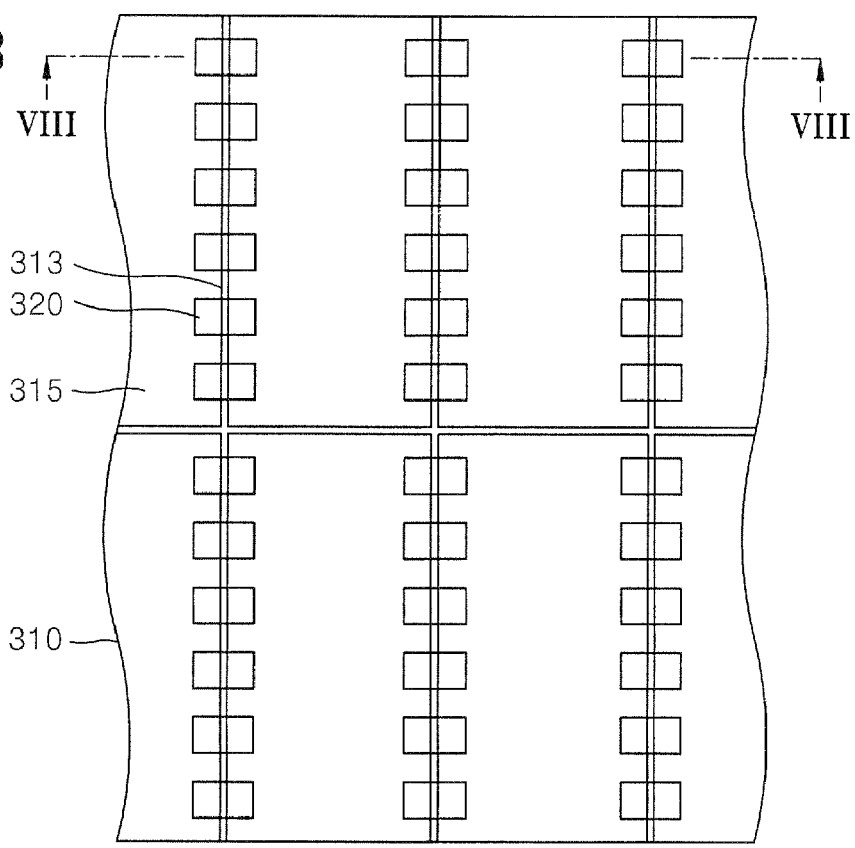
Figure 8B:
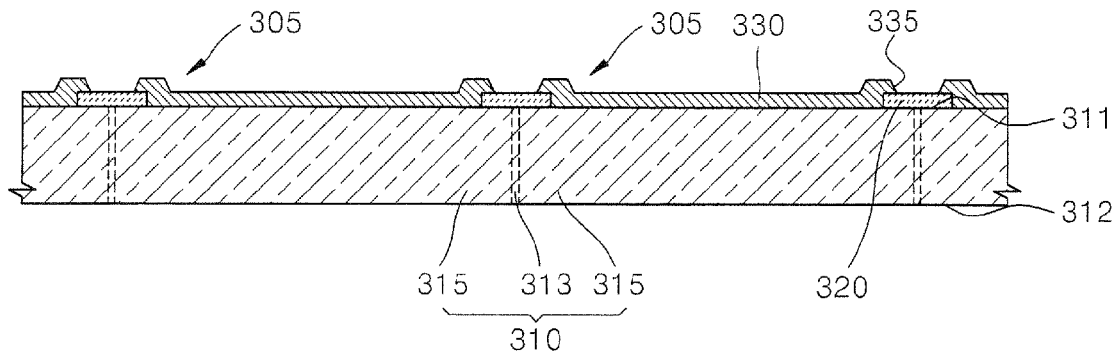

FIG. 7B is a plan view illustrating a wafer level package after metal pads 320 are formed, and FIG. 8B is a cross-sectional view illustrating a wafer level package after an insulating layer 330 having openings 335 is formed. Referring to FIGS. 7B and 8B, metal pads 320 are formed on a front surface 311 of the wafer 310. The metal pads 320 are formed at edges of the semiconductor chip regions 315 and across the scribe lanes 313. That is, the metal pads 320 are formed at the edges of the adjacent semiconductor chip regions 315 and across the scribe lane 313 between the semiconductor chip regions 315. An insulating layer 330 for passivation is formed on the front surface 311 of the wafer 310 having the metal pads 320. The insulating layer 330 is etched to form openings 335 for exposing parts of the metal pads 320. Each opening 335 exposes the metal pad 320 corresponding to both the scribe lane 313 and portions of the semiconductor chip regions 315 adjacent to the scribe lane 313. Semiconductor chips 305 are then arranged in the semiconductor chip regions 315. The semiconductor chips 305, which are arranged on the neighboring semiconductor chip regions 315 with the scribe lane 313 between them, share metal pads 320 and connection terminals 340 (shown in FIG. 8C) connected thereto.

Figure 7C:
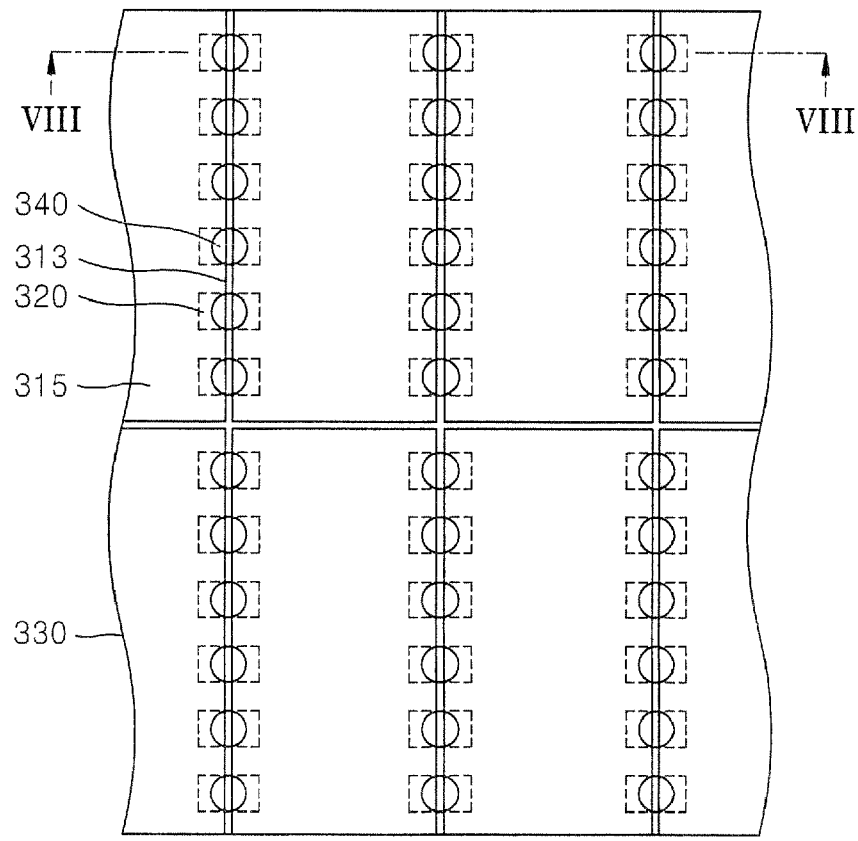
Figure 8C:
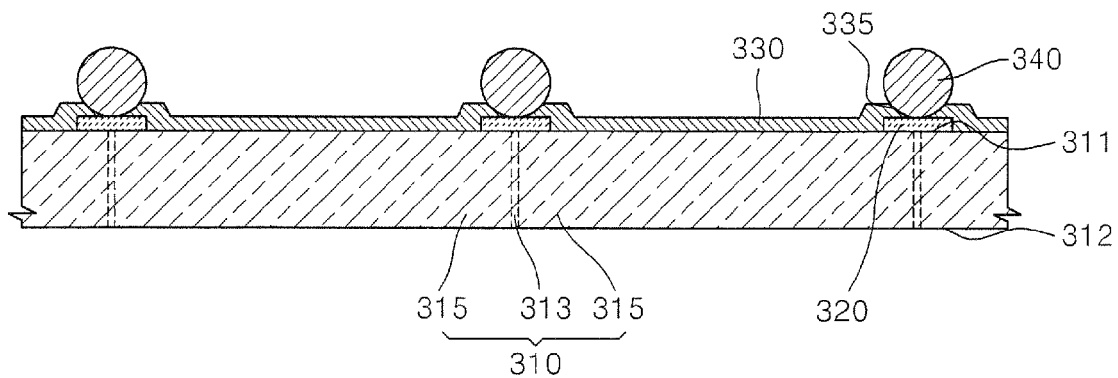

Referring to FIGS. 7C and 8C, the connection terminal 340 is formed on each metal pad 320, which is exposed through the opening 335 of the insulating layer 330. The connection terminal 340 is electrically connected to the metal pad 320 on the scribe lane 313. For the connection terminal 340, a bump or solder ball may be formed through a wire bonding process.

Figure 7D:
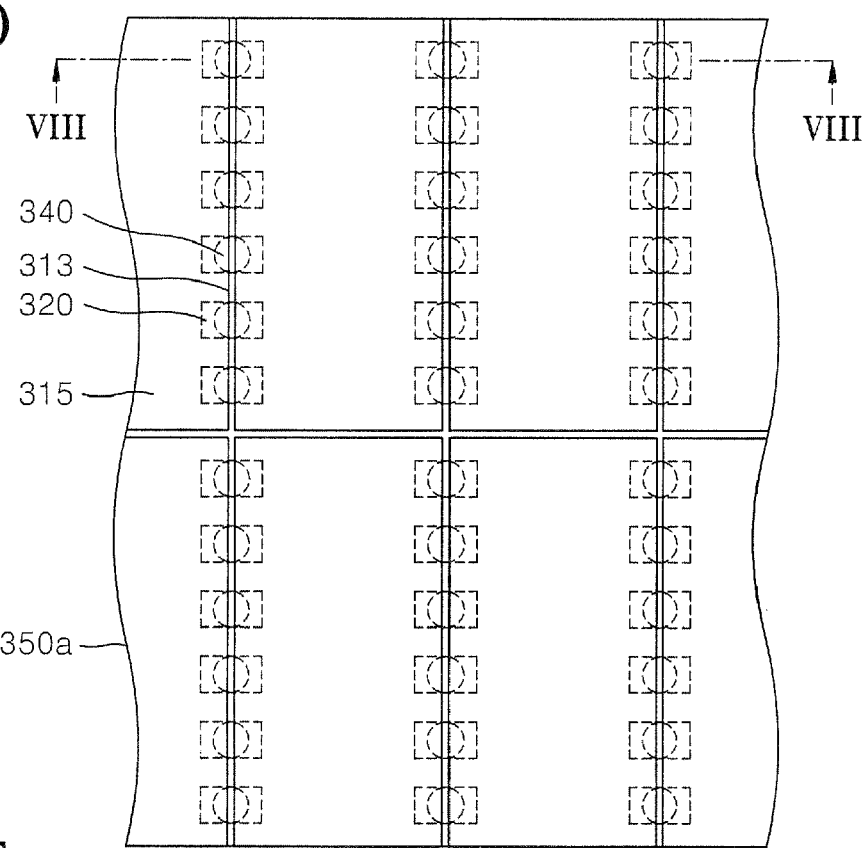
Figure 8D:
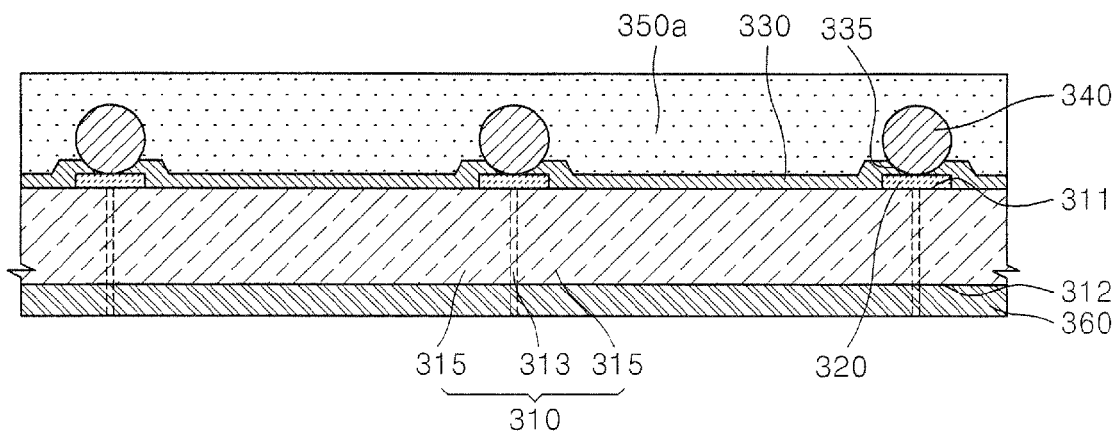

Referring to FIGS. 7D and 8D, the front surface 311 of the wafer 310, on which the connection terminals 340 are formed and a rear surface 312 are respectively molded with epoxy molding compounds 350a and 360 through an epoxy molding process. The epoxy molding compounds 350a and 360 serve as a front reinforcing member and a rear reinforcing member, respectively. The wafer 310 may have a desired thickness formed through a back-lap process of its rear surface 312 prior to the molding process.

The rear reinforcing member 360 may be formed by forming an epoxy molding compound to a desired thickness d4 on the rear surface 312 of the wafer 310 through a molding process or by forming a thick epoxy molding compound on the rear surface 312 of the wafer 310 through a molding process and then lapping the epoxy molding compound to the desired thickness d4.

Figure 7E:
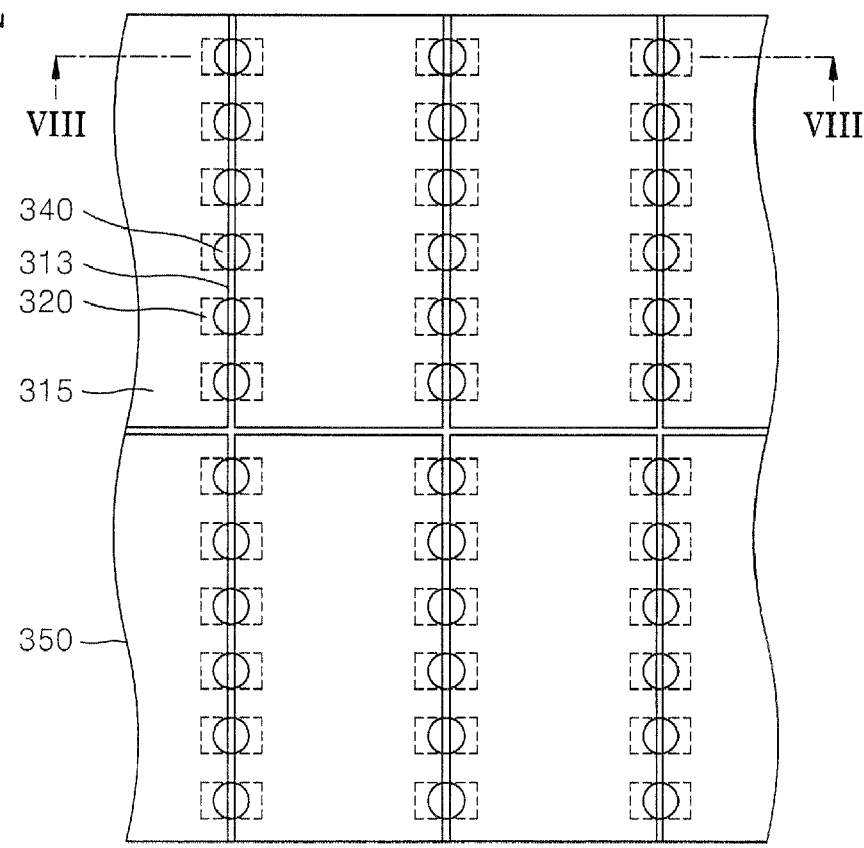
Figure 8E:
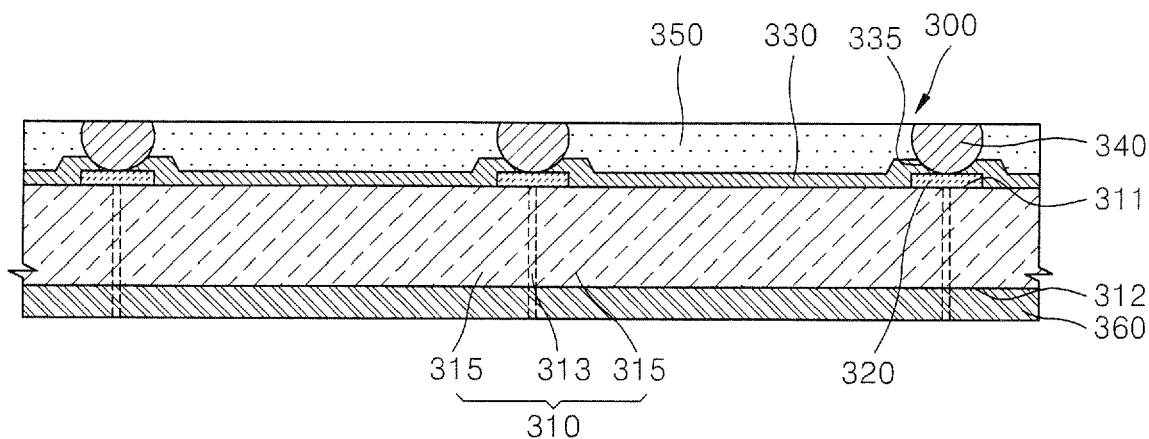

Referring to FIGS. 7E and 8E, the epoxy molding compound 350a on the front surface 311 of the wafer 310 is lapped to a predetermined thickness to form a front reinforcing member 350. In this embodiment, the process of lapping the epoxy molding compound 350a is performed until the connection terminals 340 are exposed. When the connection terminals 340 in FIGS. 7D and 8D have for example a ball shape, the lapping process may be performed until the size of the connection terminals 340 becomes ½ of the previous size since an exposed area of the top surface (342 in FIG. 6B) of the connection terminals 340 is maximized when the size of the ball becomes ½. This is for obtaining a maximum contact area when an electrical contact with an external circuit is made through the top surface 342 of the connection terminals 340.

Figure 7F:
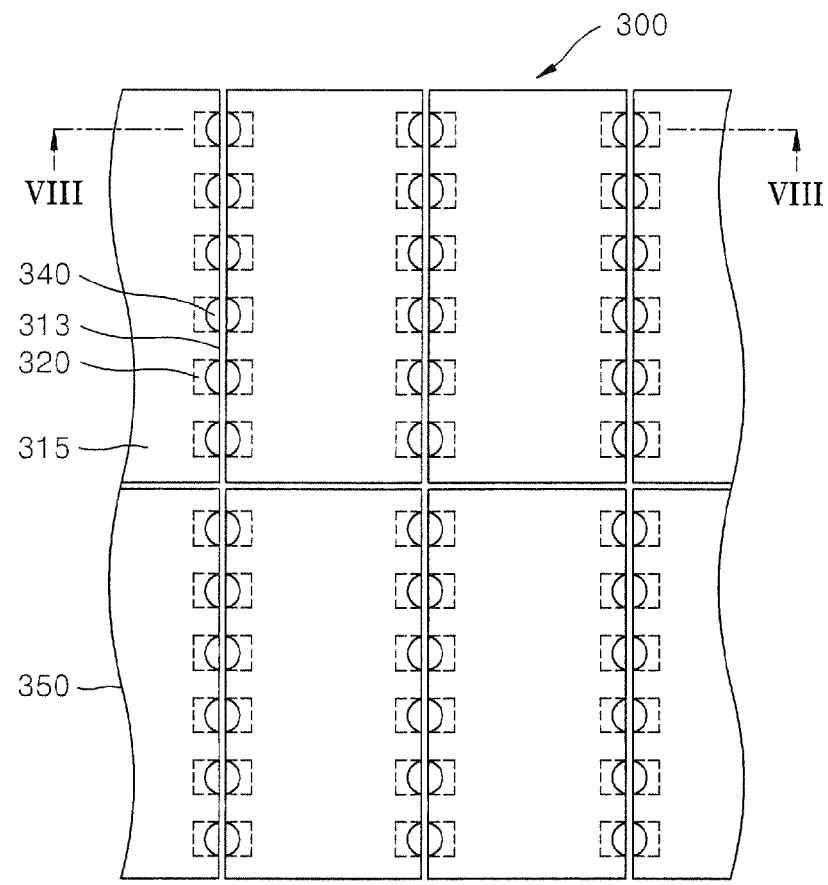
Figure 8F:
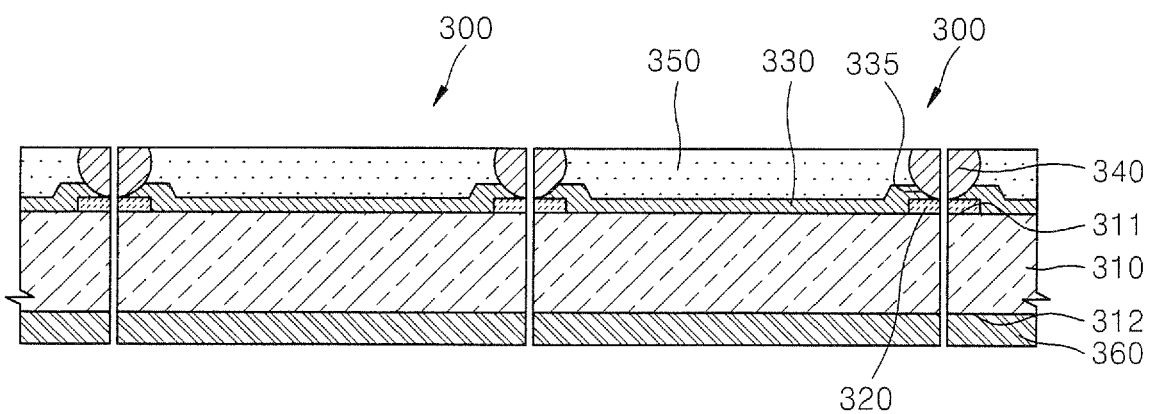

Referring to FIGS. 7F and 8F, the wafer 310 is cut along each scribe lane 313 using a laser beam or a blade, thereby obtaining the discrete semiconductor package 300 as shown in FIGS. 6A to 6C. The metal pads 320 and the connection terminals 340, which are shared between the semiconductor chips 305 arranged on the adjacent semiconductor chip regions 315 with the scribe lane 313 interposed therebetween, are separated through the above cutting process. In this case, sizes of the metal pads 320 and the connection terminals 340 may be substantially half of the previous sizes. The top and side surfaces 342 and 341 of each connection terminal 340 are exposed, such that electrical connection with an external circuit is made through the top and side surfaces 342 and 341.

Figure 9:
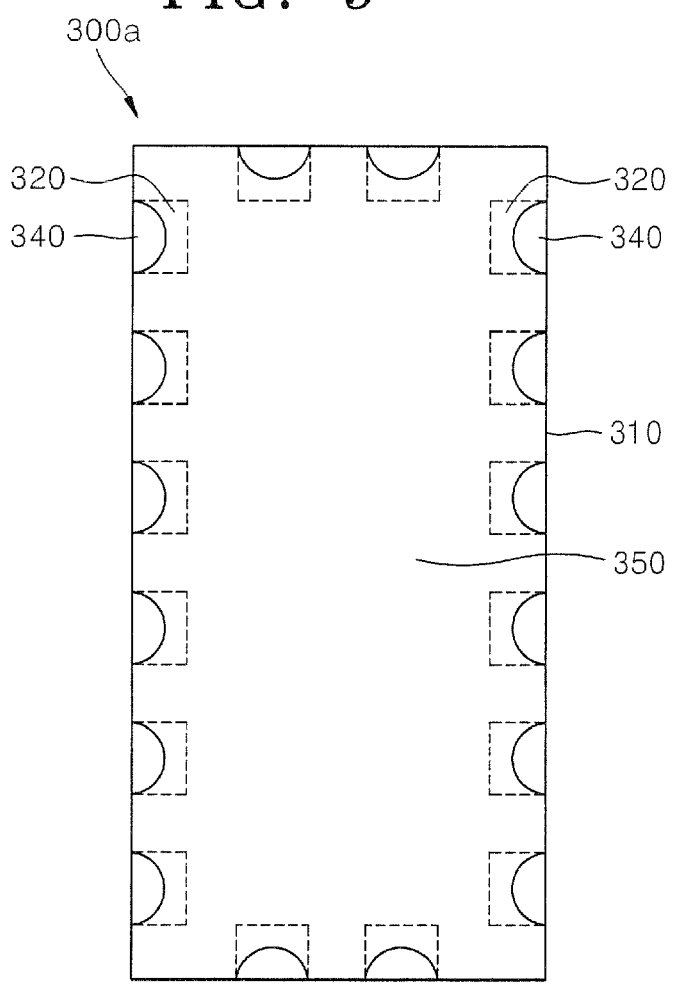
FIG. 9 is a plan view illustrating a wafer level package according to another embodiment of the present invention.

FIG. 9 is a plan view illustrating a wafer level package according to another embodiment of the present invention. A wafer level package 300a includes metal pads 320 and connection terminals 340 formed on four sides of the wafer level package 300a along edges of a wafer 310. Thus, the pitch between the connection terminals can be improved and the number of the connection terminals can be increased without increasing the size of the semiconductor chip. The cross-section of the wafer level package 300a is similar to that of the wafer level package 300 shown in FIGS. 6A through 6C, and the fabrication method thereof is similar to that of the wafer level package 300 shown in FIGS. 7A through 7F and 8A through 8F. Thus, a further detailed description thereof will be omitted.

Figure 10:
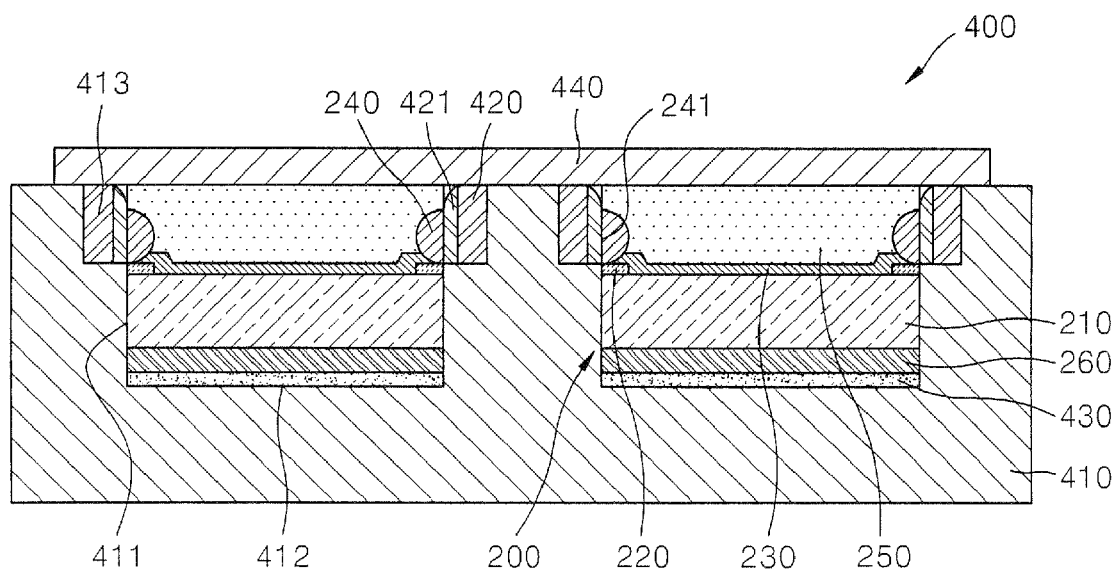
FIG. 10 is a cross-sectional view illustrating a semiconductor module according to another embodiment of the present invention.

FIG. 10 is a cross-sectional view illustrating a semiconductor module according to another embodiment of the present invention. Referring to FIG. 10, a semiconductor module 400 includes a semiconductor package 200, and a circuit board 410, e.g., printed circuit board 410 on which the semiconductor package 200 is mounted. The semiconductor package 200 may be similar to the wafer level package 200 shown in FIGS. 2A to 2C. The printed circuit board 410 includes first groove 411 in which a semiconductor package 200 is mounted, and a plurality of second grooves 413 formed at edges of the first groove 411. The second grooves 413 are arranged in a row along the edges of the first groove 411. The first groove 411 has a depth and width determined at least in part with consideration for the thickness and size of the semiconductor package 200. The second grooves 413 may correspond to the connection terminals 240 arranged in the semiconductor package 200 such that each connection terminal 240 has a second groove 413 associated with it. The second grooves 413 may have a width and depth determined in consideration of the type of electrical connection specified between the connection terminals 240 of the semiconductor package 200 and external devices (not shown). A wiring pattern 420 is buried in each of the second grooves 413.

Each semiconductor package 200 is mounted on a surface 412 delimiting the bottom of a first groove 411 of the printed circuit board 410 with an adhesive agent 430. The connection terminals 240 of the semiconductor package 200 are electrically connected to the wiring patterns 420 buried in the second grooves 413. A plating 421 made, for example, of Al may be formed on side surfaces of the wiring patterns 420 exposed by the first groove 411. The plating 421 has a thickness of about 5 to about 20 µm. The plating 421 may be melted by a reflow process to reinforce an electrical connection between a wiring pattern 420 of the printed circuit board 410 and connection terminals 240 of the semiconductor package 200.

A passivation layer 440 is arranged on the printed circuit board 410 to protect the semiconductor package 200. With the passivation layer 440, e.g., a sheet of an insulating material and a thermal-conductive material, the semiconductor package 200 can be protected from external shocks while that heat from the semiconductor package 200 can still be outwardly radiated.

In the semiconductor module 400, the wiring patterns 420 are buried in the second grooves 413 of the printed circuit board 410 so that they make contact only through the side surfaces 241 of the connection terminals 240 of the semiconductor package 200 and not to be brought in contact with the exposed wafer 210. This arrangement helps prevent the generation of leakage currents.

In the embodiment shown in FIG. 10, the first groove 411 of the printed circuit board 410 has a depth corresponding to the thickness of the semiconductor package 200 such that the semiconductor package 200 is completely buried in the first groove 411. However, in other embodiments the depth of the first groove 411 may be smaller than the thickness of the semiconductor package 200 so that the semiconductor package 200 protrudes from the top surface of the printed circuit board 100.

Figure 11A:
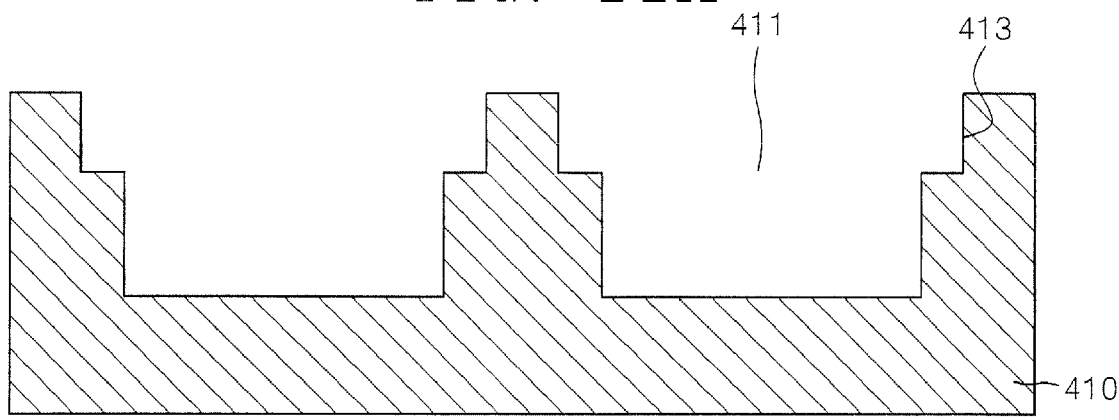
FIGS. 11A through 11D are cross-sectional views illustrating a method of fabricating the semiconductor module of FIG. 10.

FIGS. 11A through 11D are cross-sectional views illustrating a method of fabricating the semiconductor module of FIG. 10. Referring to FIG. 11A, a semiconductor package (such as the package 200 shown in FIG. 2B) and a printed circuit board 410 on which the semiconductor package 200 will be mounted are provided. The printed circuit board 410 includes the first groove 411 and the second grooves 413. Since the second grooves 413 are formed contiguous until the edges of the first groove 411 and arranged in a row, one side surface of each of the second grooves 413 is exposed by the first groove 411.

Figure 11B:
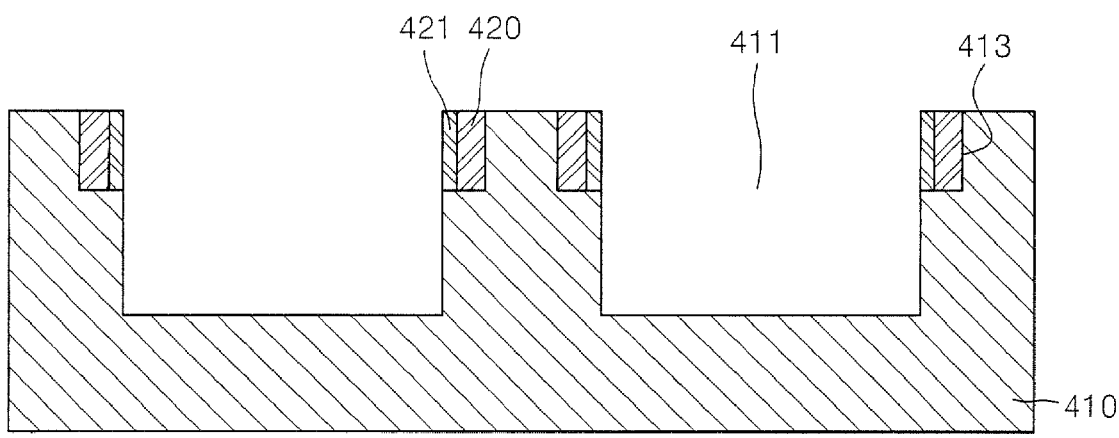

Referring to FIG. 11B, the wiring pattern 420 is formed in the second groove 413 of the printed circuit board 410, and the plated layer 421 is formed to a thickness of about 5 to about 20 μm using Al or the like on the side surface of the wiring pattern 420 exposed by the first groove 411. The wiring patterns 420 are wiring layers for electrical contact with the connection terminals 240 of the semiconductor package 200.

Figure 11C:
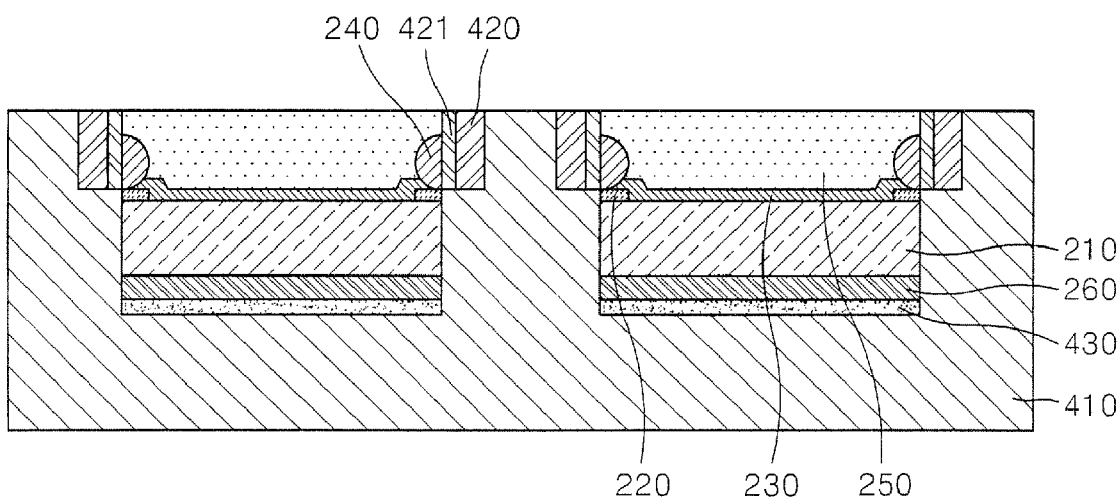

Referring to FIG. 11C, each semiconductor package 200, the top surface of which is covered by a front reinforcing member 250 and which has connection terminals 240 whose side surfaces are exposed, is mounted on the surface delimiting the bottom of a first groove 411 of the printed circuit board 410 using an adhesive agent 430. In this case, the exposed side surfaces of each row of the connection terminals 240 of the semiconductor package 200 are brought in electrical contact with a wiring pattern 420 of the printed circuit board 410.

Figure 11D:
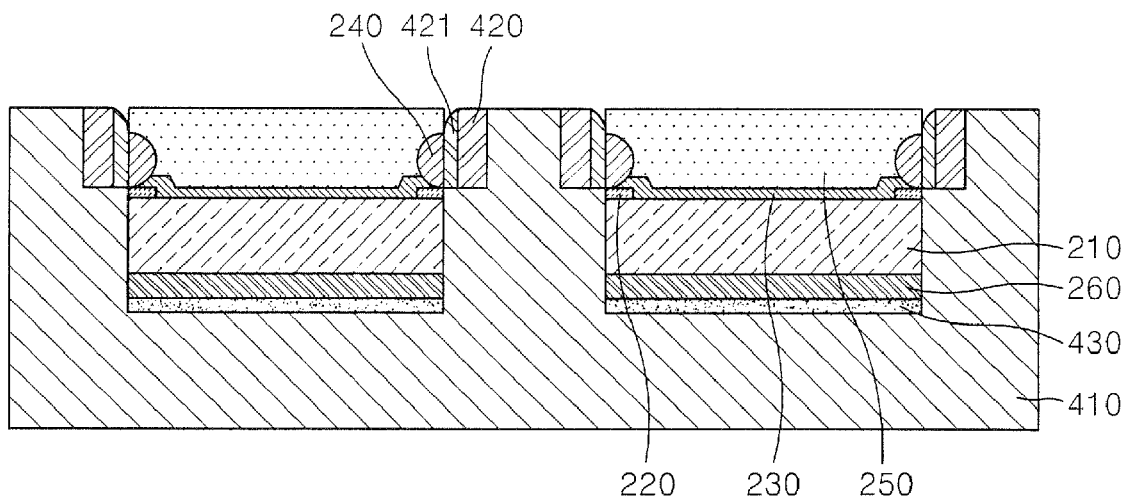

Referring to FIG. 11D, a reflow process is performed to reinforce the contact between the connection terminals 240 and the wiring pattern 420. In this case, the plated layer 421, which may be formed of Al, melts in the reflow process, and flows into the area between the connection terminals 240 and the wiring pattern 420, thereby reinforcing and improving the contact between the connection terminals 240 and the wiring pattern 420. A passivation layer 440 may then be adhered to the top surface of the front reinforcing member 250 of the semiconductor package 200 (as shown in FIG. 10), thereby protecting the semiconductor package 200 from external shocks while still allowing heat from the semiconductor package 200 to be outwardly radiated.

Figure 12:
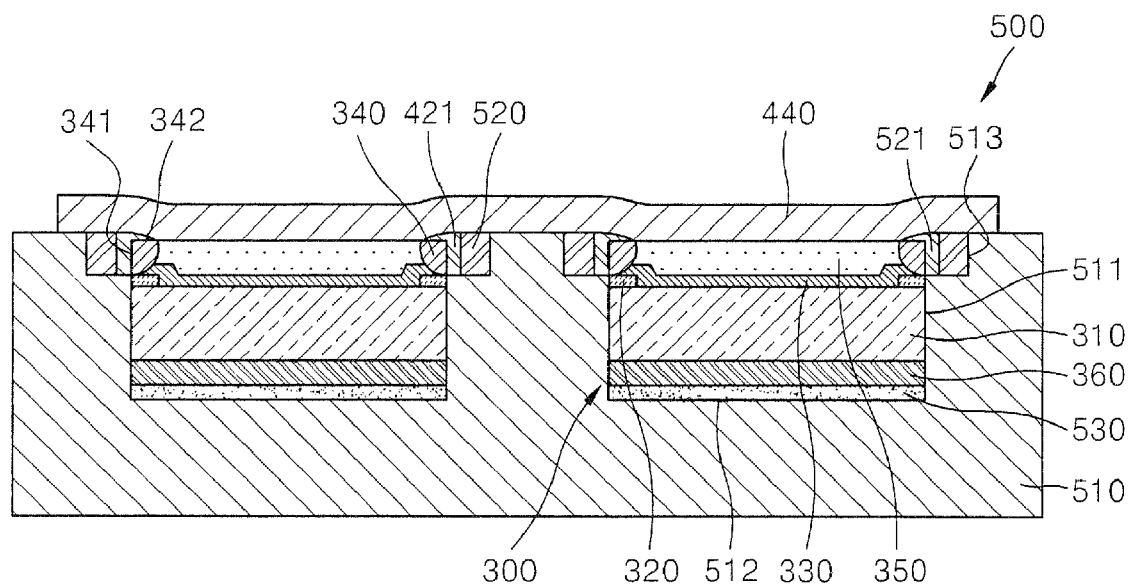
FIG. 12 is a cross-sectional view illustrating a semiconductor module according to an embodiment of the present invention.

FIG. 12 is a cross-sectional view illustrating a semiconductor module according to another embodiment of the present invention. A semiconductor module 500 includes a semiconductor package 300, and a circuit board, e.g., printed circuit board 510 on which the semiconductor package 300 is mounted. The semiconductor package may be similar to the wafer level package 300 shown in FIGS. 6A to 6C. The semiconductor module 500 shown in FIG. 12 may be similar to the semiconductor module 400 shown in FIG. 10 except that each connection terminal 340 of the semiconductor package 300 is brought in electrical contact with a wiring pattern 520 of the printed circuit board 510 through a top surface 342 and a side surface 341 of the connection terminal 340. In this case, since side and top surfaces 342 and 341 of the connection terminals 340 of the semiconductor package 300 are exposed, a plated layer 521 may flow onto the top surface of the connection terminal 340 as well as into the area between the connection terminal 340 and the wiring pattern 520 in a reflow process, thereby reinforcing and improving the electrical contact between the wiring pattern 520 and the connection terminal 340 of the semiconductor package 300.

A method of fabricating the semiconductor module 500 shown in FIG. 12 is similar to the method of fabricating the semiconductor module 400 shown in FIGS. 11A through 11D. Thus a detailed description thereof will be omitted.

In other embodiments, the semiconductor package 300 may have a printed circuit board having a top surface on which wiring patterns are arranged, instead of the printed circuit board comprising the wiring patterns arranged in the groove. In this case, the semiconductor package 300 may be electrically connected to the wiring patterns of the printed circuit board through the exposed top surface 341 of the connection terminals 340, for example, by soldering.

As described above, embodiments of the present invention may have the following advantages:

First, a wiring length can be reduced by directly forming the connection terminals with the external circuit on the metal pads, such that the present invention can be advantageously applied to a high-speed semiconductor chip, thereby improving the characteristics of the semiconductor chip.

Second, the connection terminals with the external circuit are supported by the front reinforcing member, thereby preventing failures caused by solder balls, e.g., failure of contact with the external circuit due to disconnection of the solder balls from a semiconductor chip or damage of the solder balls by external shock.

Third, the package may have a similar size to the chip, where the connection terminals can be arranged at four sides of the semiconductor package, thereby facilitating arrangement of a plurality of connection terminals. In addition, the pitch between the connection terminals can be minimized, thereby obtaining fine pitch connection terminals and implementing a wafer level package with a multi-pin.

Fourth, two connection terminals may be obtained from one solder ball or bump by forming a pad across adjacent semiconductor chip regions with the scribe lane interposed therebetween, forming the solder ball or bump on the pad, and then cutting the wafer through a sawing process, thereby reducing the fabrication cost and simplifying a semiconductor fabrication process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a semiconductor wafer having first and second opposite surfaces, and an outer peripheral sidewall surface extending between the first and second opposite surfaces;
   a plurality of conductive pads disposed along an edge of the first surface of the semiconductor wafer proximate the outer peripheral sidewall surface;
   an insulating layer disposed on the first surface of the semiconductor wafer, the insulating layer covering only one portion of each conductive pad, wherein an opening in the insulating layer exposes another portion of the conductive pad;

a plurality of connection terminals each extending through an opening in the insulating layer so as to be disposed on and electrically connected to a respective one of the conductive pads; and a reinforcing member disposed on the insulating layer and in contact with each connection terminal, and wherein each connection terminal has a side surface substantially coplanar with the outer peripheral sidewall surface of the semiconductor wafer such that the side surface of each connection terminal is exposed at a side of the package.

2. The semiconductor package of claim 1, wherein each conductive pad has a side surface that is substantially coplanar with the outer peripheral sidewall surface of the semiconductor wafer and the side surface of the connection terminal disposed thereon such that the side surface of each conductive pad is also exposed at a side of the package.

3. The semiconductor package of claim 1, wherein each connection terminal has a top surface exposed by the reinforcing member.

4. The semiconductor package of claim 1, wherein the reinforcing member covers the top of each connection terminal, and the thickness of the reinforcing member between the top surface of the reinforcing member and the tops of the connection terminals is about 200 μm or less.

5. The semiconductor package of claim 4, wherein the thickness of the reinforcing member between the top surface of the reinforcing member and the tops of the connection terminals is about 50 to about 200 μm.

6. The semiconductor package of claim 1, wherein the reinforcing member comprises an epoxy molding compound.

7. The semiconductor package of claim 1, further comprising a rear reinforcing member disposed on the second surface of the semiconductor wafer.

8. The semiconductor package of claim 7, wherein the rear reinforcing member has a thickness of about 100 μm or less.

9. The semiconductor package of claim 8, wherein the rear reinforcing member has a thickness of about 50 to about 100 μm.

10. The semiconductor package of claim 7, wherein the rear reinforcing member comprises an epoxy molding compound.

11. A semiconductor module comprising:
a circuit board including a first groove, and a plurality of second grooves arranged along edges of the first groove and formed contiguous with the edges of the first groove;
a plurality of wiring patterns buried in the second grooves of the circuit board; and
a semiconductor package disposed in the first groove, the semiconductor package comprising:
  a semiconductor wafer mounted in the first groove of the circuit board and including first and second opposite surfaces,
  a plurality of conductive pads arranged on the first surface along at least one edge of the semiconductor wafer,
  a plurality of connection terminals arranged on and electrically connected to the conductive pads respectively, and
  a reinforcing member arranged on the wafer to cover a portion of the connection terminals, wherein at least a side surface of each connection terminal is exposed, and
wherein at least the exposed side surfaces of connection terminals electrically connect with the wiring patterns of the circuit board.

12. The semiconductor module of claim 11, wherein the reinforcing member is formed on the wafer to expose the side surface and a top surface of each connection terminal.

13. The semiconductor module of claim 12, wherein the reinforcing member comprises an epoxy molding compound, and a thickness between a top surface of the reinforcing member and the connection terminal is about 50 to about 200 μm.

14. The semiconductor module of claim 11, further comprising a rear reinforcing member arranged on the second surface of the semiconductor wafer.

15. The semiconductor module of claim 14, wherein the rear reinforcing member comprises an epoxy molding compound having a thickness of about 50 to about 100 μm.

16. The semiconductor module of claim 12, further comprising a plating layer for reinforcing the electrical connection between the wiring pattern of the circuit board and the connection terminal of the semiconductor package.

17. The semiconductor module of claim 16, wherein the plating layer comprises an Al plated layer having a thickness of about 5 to about 20 μm.

18. The semiconductor module of claim 11, further comprising a passivation layer arranged on the circuit board to cover the reinforcing member.

19. The semiconductor module of claim 18, wherein the passivation layer comprises an insulating sheet having thermal conductivity.

20. The semiconductor module of claim 11, wherein a bottom surface of the first groove of the circuit board is adhered to the second surface of the wafer by an adhesive agent, so that the semiconductor package is mounted in the first groove of the circuit board.

21. A method of fabricating a semiconductor module, comprising:
providing a circuit board including a first groove, and a plurality of second grooves arranged along edges of the first groove and formed contiguous with the edges of the first groove;
providing a semiconductor package, the semiconductor package comprising a semiconductor wafer including first and second opposite surfaces, a plurality of conductive pads arranged on the first surface along at least one edge of the semiconductor wafer, a plurality of connection terminals arranged on and electrically connected to the conductive pads respectively, and a reinforcing member arranged on the wafer to cover a portion of each connection terminal,
wherein at least a side surface of each connection terminal is exposed;
burying a plurality of wiring patterns in the second grooves of the circuit board; and
mounting the semiconductor package in the first groove of the circuit board, so as to bring each wiring pattern of the circuit board into electrical contact with at least the exposed side surface of each connection terminal of the semiconductor package.

22. The method of claim 21, wherein the reinforcing member is formed on the wafer to expose the side surface and a top surface of each connection member.

23. The method of claim 21, wherein the reinforcing member comprises an epoxy molding compound, and a thickness between a top surface of the reinforcing member and the connection terminal is about 50 to about 200 μm.

24. The method of claim 23, further comprising forming a rear reinforcing member on the second surface of the semiconductor wafer.

25. The method of claim 24, wherein the rear reinforcing member comprises an epoxy molding compound having a thickness of about 50 to about 100 µm.

26. The method of claim 21, further comprising:
forming a plating layer for reinforcing the electrical connection between the wiring pattern of the circuit board and the connection terminal of the semiconductor package after the forming of the wiring pattern in the second groove of the circuit board; and
reflowing the plating layer after mounting the semiconductor chip in the first groove.

27. The method of claim 26, wherein the plating layer comprises an Al plated layer having a thickness of about 5 to about 20 µm.

28. The method of claim 21, further comprising forming a passivation layer on the circuit board to cover the reinforcing member after mounting the semiconductor package in the first groove of the circuit board.

29. The method of claim 28, wherein the passivation layer comprises an insulating sheet having thermal conductivity.

30. The method of claim 21, wherein mounting the semiconductor package in the first groove of the circuit board includes adhering a bottom surface of the first groove of the circuit board to the second surface of the wafer by an adhesive agent.

* * * * *